US 8,536,041 B2

(12) United States Patent
Chang et al.

(10) Patent No.: US 8,536,041 B2
(45) Date of Patent: Sep. 17, 2013

(54) METHOD FOR FABRICATING TRANSISTOR WITH HIGH-K DIELECTRIC SIDEWALL SPACER

(75) Inventors: Leland Chang, New York, NY (US); Isaac Lauer, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/559,182

(22) Filed: Jul. 26, 2012

(65) Prior Publication Data

US 2012/0289014 A1    Nov. 15, 2012

Related U.S. Application Data

(62) Division of application No. 12/113,510, filed on May 1, 2008, now Pat. No. 8,232,604.

(51) Int. Cl.
*H01L 29/78* (2006.01)
*H01L 27/01* (2006.01)

(52) U.S. Cl.
USPC ........... 438/592; 438/289; 438/305; 257/344; 257/351; 257/369; 257/412; 257/E21.202; 257/E21.205; 257/E21.433; 257/E21.455; 257/E29.135; 257/E29.266

(58) Field of Classification Search
USPC .............. 438/289, 305, 592; 257/244, 351, 257/369, 412, E21.202, E21.205, E21.433, 257/E21.455, E29.135
See application file for complete search history.

(56) References Cited

U.S. PATENT DOCUMENTS

| | | | |
|---|---|---|---|
| 5,583,067 A | 12/1996 | Sanchez | |
| 5,585,295 A | 12/1996 | Wu | |
| 5,994,192 A | 11/1999 | Chen | |
| 6,057,576 A * | 5/2000 | Hsia et al. | 257/344 |
| 6,180,465 B1 | 1/2001 | Gardner et al. | |
| 6,207,485 B1 | 3/2001 | Gardner et al. | |
| 6,271,563 B1 | 8/2001 | Yu et al. | |
| 6,420,220 B1 | 7/2002 | Gardner et al. | 438/151 |
| 6,551,913 B1 | 4/2003 | Kim et al. | |
| 6,949,481 B1 | 9/2005 | Halliyal et al. | |
| 7,449,403 B2 | 11/2008 | Kim et al. | |
| 8,076,734 B2 * | 12/2011 | Zhu | 257/401 |
| 2005/0023567 A1 * | 2/2005 | Nishinohara | 257/204 |
| 2005/0062097 A1 | 3/2005 | Misra et al. | |
| 2005/0121733 A1 | 6/2005 | Chen et al. | |
| 2005/0127459 A1 | 6/2005 | Chiu et al. | |
| 2005/0186744 A1 | 8/2005 | Abadeer et al. | |
| 2006/0084247 A1 | 4/2006 | Liu | |
| 2007/0048918 A1 * | 3/2007 | Shibata et al. | 438/197 |
| 2007/0128786 A1 | 6/2007 | Cheng et al. | 438/199 |
| 2007/0138563 A1 * | 6/2007 | Callegari et al. | 257/369 |

(Continued)

*Primary Examiner* — Dao H Nguyen
(74) *Attorney, Agent, or Firm* — Stephen Bongini; Fleit Gibbons Gutman Bongini & Bianco PL (57) ABSTRACT

A method is provided for fabricating a transistor. The transistor includes a silicon layer including a source region and a drain region, a gate stack disposed on the silicon layer between the source region and the drain region, and a sidewall spacer disposed on sidewalls of the gate stack. The gate stack includes a first layer of high dielectric constant material, a second layer comprising a metal or metal alloy, and a third layer comprising silicon or polysilicon. The sidewall spacer includes a high dielectric constant material and covers the sidewalls of at least the second and third layers of the gate stack. Also provided is a method for fabricating such a transistor.

20 Claims, 6 Drawing Sheets

(56) References Cited

U.S. PATENT DOCUMENTS

2008/0265343 A1 10/2008 Greene et al. ............... 257/412
2009/0181477 A1 7/2009 King et al. ............... 438/17
2009/0283830 A1 11/2009 Callegari et al. ............. 257/351

* cited by examiner

NFET            PFET

METHOD FOR FABRICATING TRANSISTOR WITH HIGH-K DIELECTRIC SIDEWALL SPACER

CROSS REFERENCE TO RELATED APPLICATIONS

This application is a divisional of prior U.S. application Ser. No. 12/113,510, filed May 1, 2008, now U.S. Pat. No. 8,232,604. The entire disclosure of U.S. application Ser. No. 12/113,510 is herein incorporated by reference.

Additionally, this application is related to application "Metal High Dielectric Constant Transistor with Reverse-T Gate," Ser. No. 12/113,527, now U.S. Pat. No. 7,736,981, and application "Method for Fabricating a Metal High Dielectric Constant Transistor with Reverse-T Gate," Ser. No. 12/113,557, now abandoned. These related applications are incorporated herein by reference in their entirety.

FIELD OF THE INVENTION

The present invention generally relates to the field of semiconductors, and more particularly relates to metal high dielectric constant transistors.

BACKGROUND OF THE INVENTION

Metal high dielectric constant (high-k) transistors, or "MHK transistors", are experiencing extremely active development in the industry. One observed problem with such transistors relates to the presence of an elevated outer fringe capacitance C of, on the order of 40-80 aF/μm. This elevated capacitance C of occurs because the gate sidewall of an MHK transistor no longer depletes as in a transistor with a conventional polysilicon gate. The elevated value of outer fringe capacitance C of is of concern because it at least impairs high frequency operation of the MHK transistor. The elevated value of this capacitance C of has a performance impact of approximately 1.25% per 10 aF, resulting in a 5%-10% decrease in performance.

Also, with the lack of gate length scaling in recent technologies, alternatives to improve short channel effects so that the gate length may be reduced become critical to reduce the overall device dimensions enough to permit scaling. However, current technologies do not provide a reduction in the parasitic Miller capacitance when metal-like materials (such as TiN) are used.

SUMMARY OF THE INVENTION

One embodiment of the present invention provides a transistor that includes a silicon layer including a source region and a drain region, a gate stack disposed on the silicon layer between the source region and the drain region, and a sidewall spacer disposed on sidewalls of the gate stack. The gate stack includes a first layer of high dielectric constant material, a second layer comprising a metal or metal alloy, and a third layer comprising silicon or polysilicon. The sidewall spacer includes a high dielectric constant material and covers the sidewalls of at least the second and third layers of the gate stack.

Another embodiment of the present invention provides a method for fabricating a transistor. According to the method, a silicon layer is provided, and a first layer is formed on the silicon layer. A second layer is formed on the first layer, and a third layer is formed on the second layer. At least the second and third layers are etched so as to form at least second and third layers of a gate stack. A sidewall spacer layer is deposited and etched so as to form a sidewall spacer on sidewalls of the gate stack. The sidewall spacer covers the sidewalls of at least the second and third layers of the gate stack. The first layer comprises a high dielectric constant material, the second layer comprises a metal or metal alloy, the third layer comprises silicon or polysilicon, and the sidewall spacer layer comprises a high dielectric constant material.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION

FIGS. 1 to 8 illustrate a process for fabricating a transistor with a high-k dielectric sidewall spacer according to an embodiment of the present invention. In these figures an NFET transistor and a PFET transistor are shown arranged in a side-by-side manner for convenience of description. However, this is not meant to limit the present invention. Embodiments of the present invention can be directed to one or more NFET transistors, one or more PFET transistors, or a combination of these two types of transistors.

Figure 1:
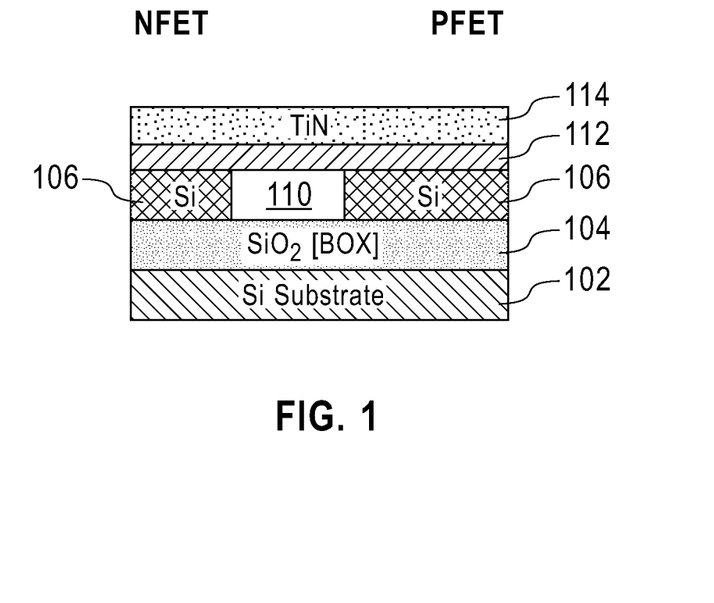
FIGS. 1 to 8 are cross-sectional views of a process for fabricating a transistor with a high-k dielectric sidewall spacer according to one embodiment of the present invention.

The process begins with a silicon-on-insulator (SOI) wafer that has a silicon substrate 102, an overlying oxide layer ("BOX") 104 (e.g., of 3 μm), and an overlying silicon layer 106. One or more STI regions 110 are formed in the silicon layer 106. Conventional hafnium dioxide ($HfO_2$) and titanium nitride (TiN) depositions are used to form a high-k dielectric layer 112 and a metal layer 114 for the gate stack, as shown in FIG. 1. The hafnium dioxide layer 112 has a k value in the range of about 20-25 (as compared to 3.9 for $SiO_2$) and has an exemplary thickness in the range of about 1-3 nm. The titanium nitride layer 114 has an exemplary thickness of about 10 nm. These layers 112 and 114 together form the (as yet unpatterned) MHK gate stack. This initial structure represents a conventional 501 CMOS with a MHK gate stack.

Figure 2:
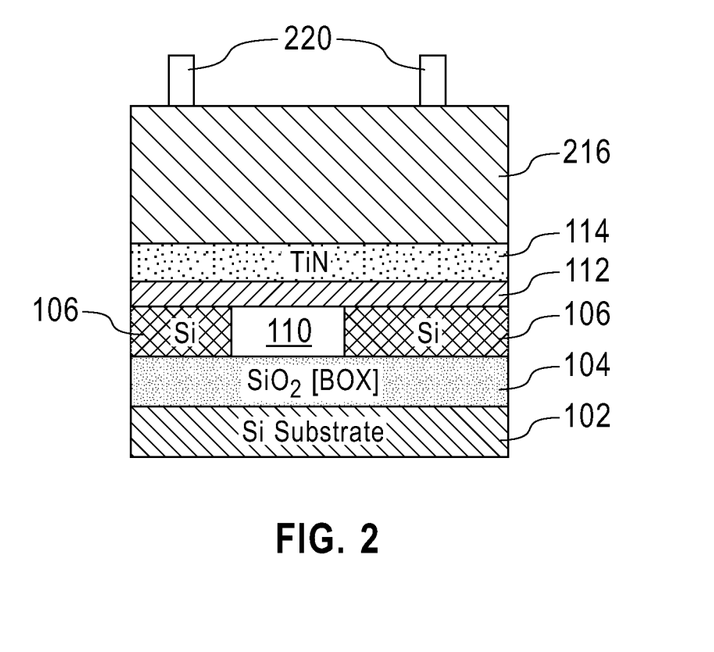
Figure 3:
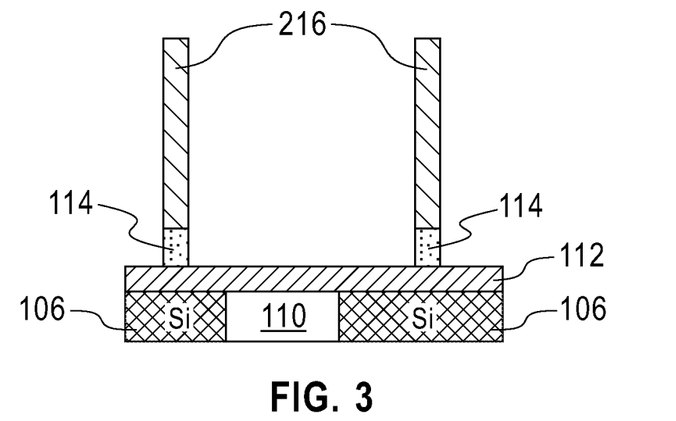

FIG. 2 shows the structure after the deposition of an amorphous silicon (or polysilicon) layer 216 having an exemplary thickness in the range of about 30-100 nm, and the subsequent deposition and patterning of a photoresist layer 220. The photoresist 220 is left where a device gate is desired to be formed. FIG. 3, which is a partial view that does not include the silicon substrate 102 and oxide layer 104 for simplicity, shows the result after a gate stack etch and subsequent removal of the photoresist 220. In this embodiment, the gate stack etch stops at the high-k material (hafnium dioxide layer 112).

Figure 4:
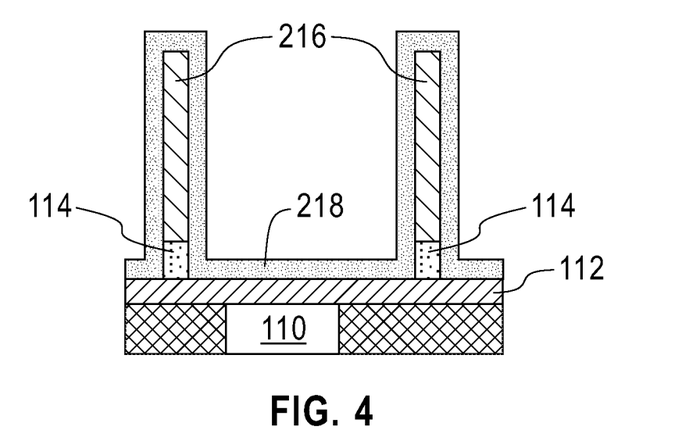

FIG. 4 shows the structure after deposition, for example a blanket deposition by chemical vapor deposition (CVD), plasma enhanced chemical vapor deposition (PECVD), or atomic layer deposition (ALD), of a high-k spacer material layer 218. As opposed to an amorphous silicon or polycrystalline silicon material, the high-k spacer material is a material with a dielectric constant greater than about 10. The high-k layer 218 of this embodiment illustratively has a thickness in the range of about 10-20 nm. As shown in FIG. 4, the high-k spacer layer 218 covers the high-k layer 112 and the exposed surfaces of the metal layer 114 and the silicon layer 216 of the gate stack. The high-k spacer layer 218 and the high-k layer 112 can comprise the same or different high-k materials.

Figure 5:
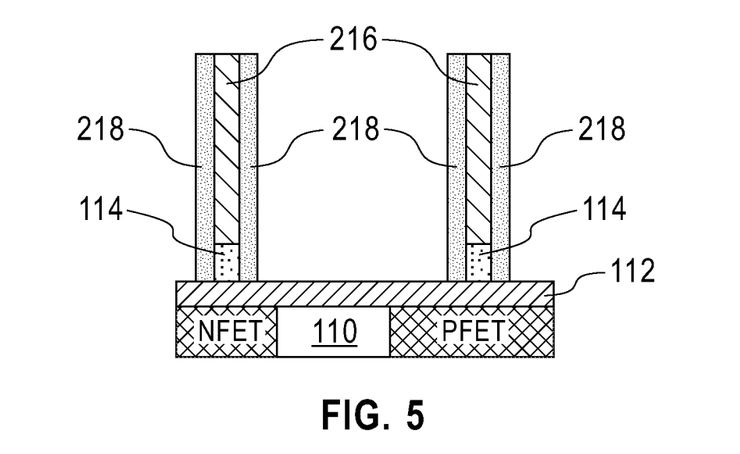
Figure 6:
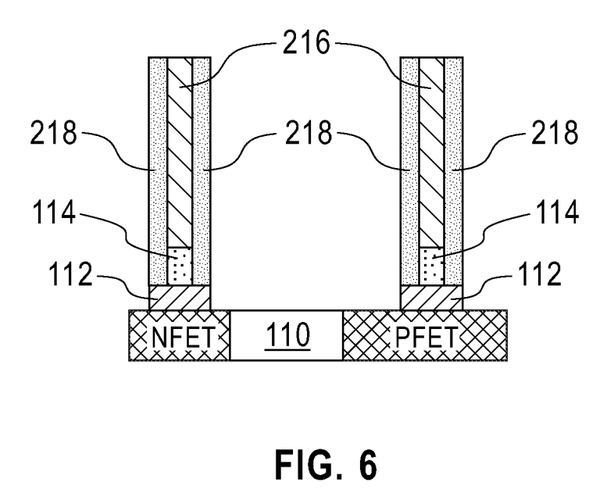

A process such as reactive ion etching (RIE) is used to selectively etch the high-k spacer layer 218 so that it remains only on the sidewalls of the gate stack, as shown in FIG. 5. Therefore, a high-k sidewall spacer is created on the sides of each of the gates, extending down to the high-k layer 112. The high-k sidewall spacer of this embodiment has an exemplary thickness of about 6-15 nm. Further, this etching is continued through the high-k hafnium dioxide layer 112, so that only the portions of the high-k layer 112 located below the gate stacks 114 and 216 and the sidewall spacers 218 remain, as shown in FIG. 6. Thus, the gate stack is formed by the high-k layer 112, the metal layer 114, and the silicon layer 216. In this gate stack, a lateral extent (width) of the high-k layer 112 is greater than a lateral extent (width) of the metal and silicon layers 114 and 216. In this embodiment, a wet etch using a dilute hydrofluoric acid (DHF) solution is used to remove portions of the high-k hafnium dioxide layer 112. Such a process is described in the article "Etching of zirconium oxide, hafnium oxide, and hafnium silicates in dilute hydrofluoric acid solutions" (V. Lowalekar et al., Materials Research Society, Vol. 19, No. 4, pp. 1149-1156), which is hereby incorporated by reference. In further embodiments, other processes are used to etch the high-k layer.

Figure 7:
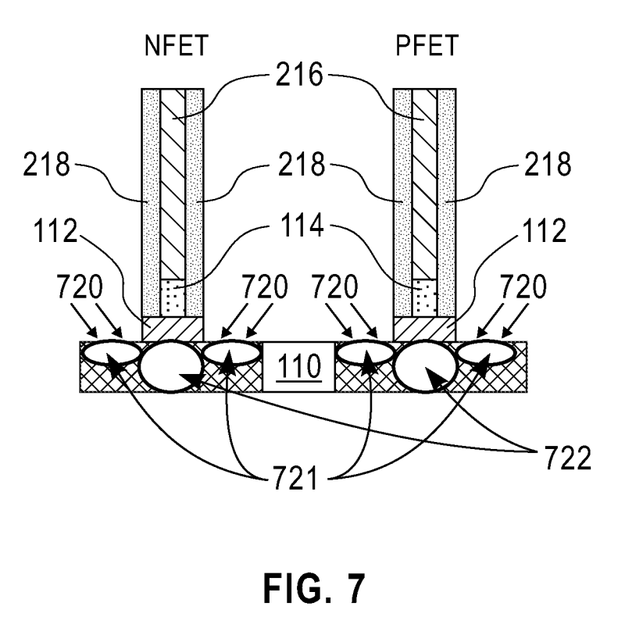

As shown in FIG. 7, extension implants 720 are then alternately performed on the NFET and PFET transistors. In particular, photolithography is used to selectively define the areas for the source/drain extension implants for the NFET and PFET, and ions are implanted. The extension implant is performed using an n-type species for the NFET, and using a p-type species for the PFET. Because of the presence of the high-k sidewall spacers, these implantations can be performed at a much lower dose than with a conventional structure having a conventional sidewall spacer, such as at an at least a 50% lower dose). For example, in preferred embodiments the implantation is performed at a dose of less than about $1.5\ e^{15}/cm^3$, and in this exemplary embodiment is performed at a dose of 0.5 to $0.8\ e^{15}/cm^3$ (compared to a typical dose of 2.0 to $3.0\ e^{15}/cm^3$ in a conventional fabrication processes).

Figure 8:
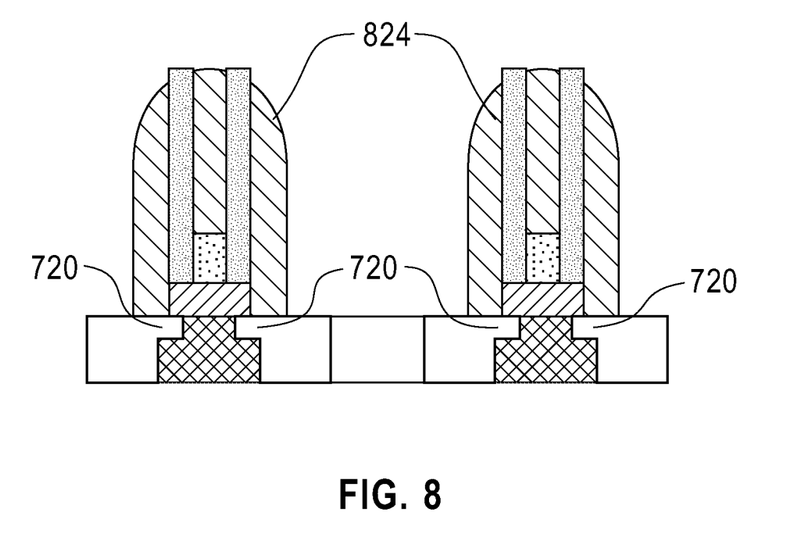

The remainder of the fabrication process is the same as the conventional CMOS fabrication process. As shown in FIG. 8, oxide and/or nitride diffusion spacers 824 are formed (for example, by PECVD). The diffusion spacers 824 of this embodiment have an exemplary thickness of about 2-10 nm. Source and drain regions are then implanted. The source/drain implant is performed using a p-type species for the NFET (for example, As or P), and using an n-type species for the PFET (for example, B or $BF_2$). A subsequent rapid thermal anneal (RTA) is performed (e.g., millisecond laser anneal or flash anneal) to provide relatively deep diffusions for the source and drain regions. Subsequent conventional processing is used to silicide the gates, sources, and drains (typically with Ni or Co) to complete the NFET and PFET transistors.

Figure 9:
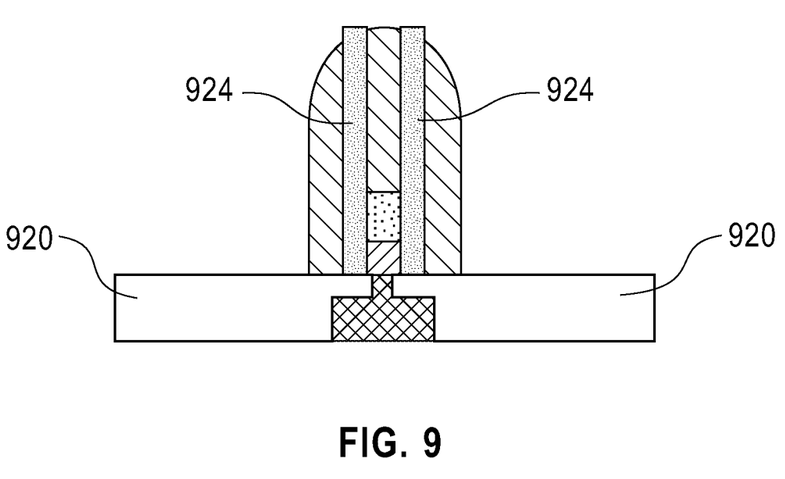
FIG. 9 is a cross-sectional view of a conventional MHK transistor.

As shown in FIG. 8, extensions 721 and halos 722 are formed in the silicon layer 106 by the extension implants and annealing. The extension implant dose and subsequent anneal operate to drive each extension implant (i.e., extension region 721) under part but not all of the high-k sidewall spacer 218, and not under any of the gate stack. That is, each high-k sidewall spacer 218 is only partially underlapped by an extension junction. This results in the effective device length Leff being greater than the physical device length Lgate. In contrast, in the conventional MHK transistor with conventional oxide and/or nitride sidewall spacers as shown in FIG. 9, the extension implant dose and anneal drive operate to drive each extension implant 920 (i.e., extension region) completely under the sidewall spacers 924 and partially under the gate stack, which causes the effective device length Leff to be less than the physical device length Lgate.

Because the present invention provides an effective device length Leff that is greater than the physical device length Lgate, the gating action of the fringing fields from the gate is enhanced, so as to invert the extension regions in proximity to the gate. The gate electrode gates both the normal inversion layer under the gate as well as regions to the left and right of the gate.

Although the overlap capacitance component from the outer fringe increases, the capacitance component from gate to extension region drops, as the direct overlap capacitance component is eliminated. The extension region can also be implanted right before the spacer deposition to reduce the effect in the region.

Figure 10:
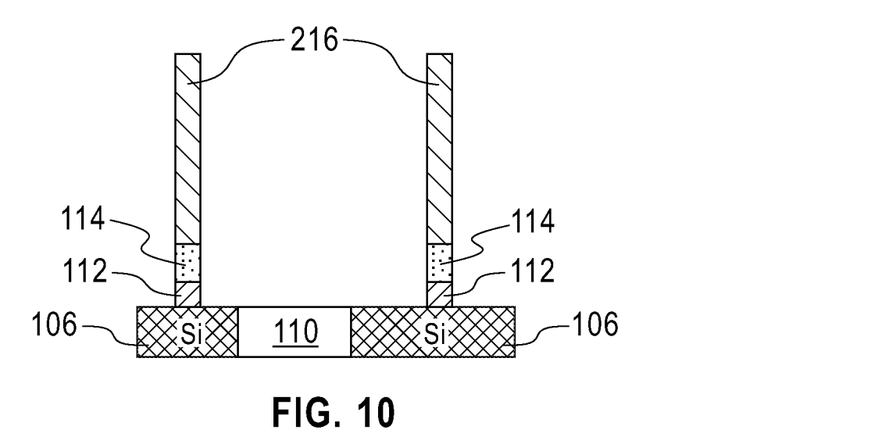
FIGS. 10 to 13 are cross-sectional views of a process for fabricating a transistor with a high-k dielectric sidewall spacer according to another embodiment of the present invention.

FIGS. 10-13 illustrate a process for fabricating a transistor with a high-k dielectric sidewall spacer according to an embodiment of the present invention. In this embodiment, the gate stack etch stops on the silicon layer 106, as shown in FIG. 10. Thus, the gate stack is formed by the high-k layer 112, the metal layer 114, and the silicon layer 216. In this gate stack, a lateral extent (width) of the high-k layer 112 is the same as a lateral extent (width) of the metal and silicon layers 114 and 216.

Figure 11:
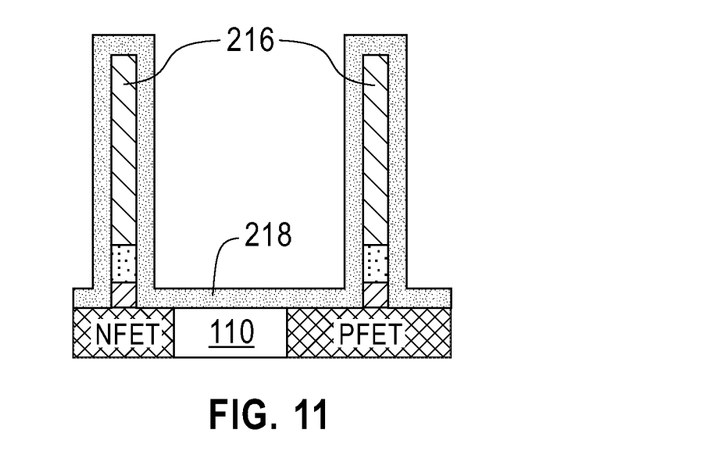

After the gate stack etch, a high-k spacer material layer 218 is deposited, for example with a thickness in the range of about 10-20 nm. As shown in FIG. 11, the high-k spacer layer 218 covers the exposed surfaces of the high-k layer 112, the metal layer 114, and the silicon layer 216 of the gate stack. The high-k spacer layer 218 and the high-k layer 112 can comprise the same or different high-k materials.

Figure 12:
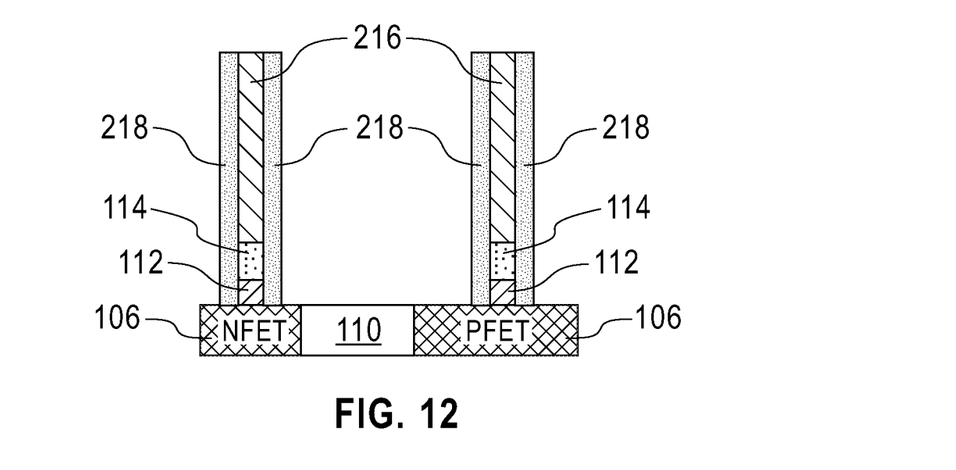

A process such as reactive ion etching (RIE) is used to selectively etch the high-k spacer layer 218 so that it remains only on the sidewalls of the gate stack, as shown in FIG. 12. Therefore, a high-k sidewall spacer is created on the sides of each of the gates, extending down to the silicon layer 106. The high-k sidewall spacer of this embodiment has an exemplary thickness of about 6-15 nm. Extension implants are then performed. Because of the presence of the high-k sidewall spacers, this implant can be performed at a much lower dose than with a conventional structure having a conventional sidewall spacer (for example, a 50% lower dose).

Figure 13:
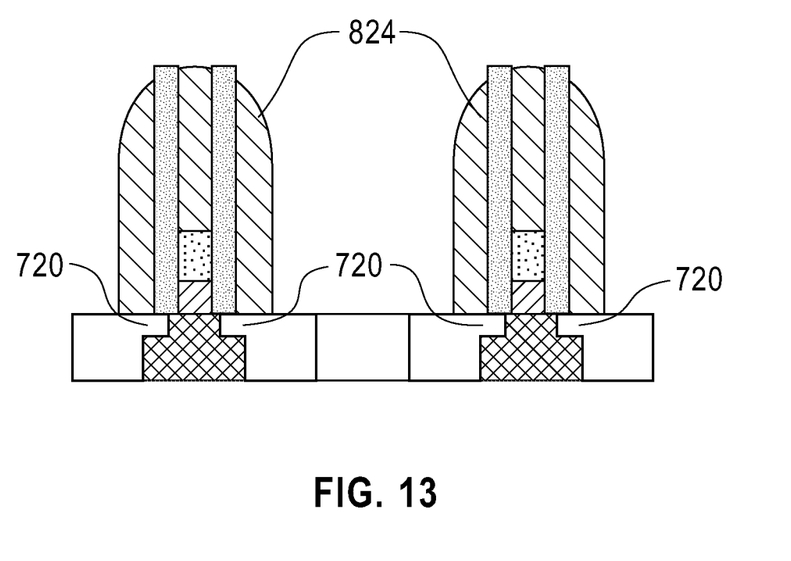

The remainder of the fabrication process is the same as in the embodiment described above. As shown in FIG. 13, oxide and/or nitride diffusion spacers 824 are formed (for example, by PECVD) with an exemplary thickness of about 2-10 nm. Source and drain region are then implanted, and a subsequent rapid thermal anneal (RTA) is performed (e.g., millisecond laser anneal or flash anneal) to provide relatively deep diffusions for the source and drain regions. Subsequent conventional processing is used to silicide the gates, sources, and drains (typically with Ni or Co) to complete the NFET and PFET transistors.

As shown in FIG. 13, in this embodiment also the extension implant dose and subsequent anneal operate to drive each extension implant (i.e., extension region 721) under part but not all of the high-k sidewall spacer 218, and not under any of the gate stack. That is, each high-k sidewall spacer 218 is only partially underlapped by an extension junction. This results in the effective device length Leff being greater than the physical device length Lgate.

The embodiments of the present invention described above are meant to be illustrative of the principles of the present invention. These MHK device fabrication processes are compatible with CMOS semiconductor fabrication methodology, and thus various modifications and adaptations can be made by one of ordinary skill in the art. All such modifications still fall within the scope of the present invention.

For example, while the exemplary embodiments of the present invention described above relate to gate structures that use hafnium dioxide for the high-k layer and titanium nitride for the metal layer, further embodiments can use other compatible materials, such as $ZrO_2$ or $HfSi_xO_y$, which both exhibit the high dielectric constant (e.g., k of approximately 20-25) needed to provide a larger equivalent oxide thickness. Similarly, other metal oxide-based materials may be used, such as a uniform or a composite layer comprised of one or more of $Ta_2O_5$, $TiO_2$, $Al_2O_3$, $Y_2O_3$ and $La_2O_5$. The metal-containing layer 114 could also be formed of another material, such as one or more of Ta, TaN, TaCN, TaSiN, TaSi, AlN, W and Mo. Additionally, in further embodiments the silicon layer 216 described above can be comprised of another material that is able to be etched, remain conductive, and withstand high temperatures. Similarly, while the embodiments described above relate to a transistor on an SOI wafer, the transistors and fabrication methods of the present invention are also applicable to bulk technologies. Likewise, the various layer thicknesses, material types, deposition techniques, and the like discussed above are not meant to be limiting.

Furthermore, some of the features of the examples of the present invention may be used to advantage without the corresponding use of other features. As such, the foregoing description should be considered as merely illustrative of the principles, teachings, examples and exemplary embodiments of the present invention, and not in limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard, or other input device, and a central processor.

What is claimed is:

1. A method for fabricating a transistor, the method comprising the steps of:
   providing a silicon layer;
   forming a first layer on the silicon layer, the first layer comprising a first high dielectric constant material;
   forming a second layer on the first layer, the second layer comprising a metal or metal alloy;
   forming a third layer on the second layer, the third layer consisting of one of silicon and polysilicon;
   etching at least the second and third layers so as to form at least second and third layers of a gate stack;
   depositing a sidewall spacer layer comprising a second high dielectric constant material;
   etching the sidewall spacer layer so as to form a sidewall spacer on sidewalls of the gate stack, the sidewall spacer covering the sidewalls of the second and third layers of the gate stack;
   implanting ions so as to form a source region and a drain region in the silicon layer on opposite sides of the gate stack; and
   implanting ions so as to form source/drain extensions in the silicon layer, each of the source/drain extensions underlying part but not all of the sidewall spacer,
   wherein a bottom surface of the second layer of the gate stack directly contacts a top surface of the first layer of the gate stack,
   a bottom surface of the third layer of the gate stack directly contacts a top surface of the second layer of the gate stack,
   the step of etching at least the second and third layers comprises performing an etch that stops on the silicon layer so as to etch the first, second, and third layers to form the first, second, and third layers of the gate stack on the silicon layer, and
   the step of etching the sidewall spacer layer comprises etching the sidewall spacer layer so that the sidewall spacer covers the sidewalls of the first, second, and third layers of the gate stack.

2. The method of claim 1, wherein the first layer comprises hafnium dioxide.

3. The method of claim 1,
   wherein a lateral extent of the second layer of the gate stack is equal to a lateral extent of the third layer of the gate stack, and
   a lateral extent of the second layer of the gate stack is equal to a lateral extent of the first layer of the gate stack.

4. The method of claim 1, further comprising the steps of:
   after the step of etching the sidewall spacer layer, depositing a diffusion spacer layer comprising a dielectric material; and etching the diffusion spacer layer so as to form a diffusion spacer on sidewalls of the sidewall spacer,
wherein in the step of implanting ions so as to form the source region and the drain region, each of the source region and the drain region underlie part but not all of the diffusion spacer.

5. The method of claim 1, further comprising the steps of:
after the step of etching the sidewall spacer layer, depositing a diffusion spacer layer comprising a dielectric material; and
etching the diffusion spacer layer so as to form a diffusion spacer on sidewalls of the sidewall spacer,
wherein in the step of implanting ions so as to form the source region and the drain region, each of the source region and the drain region underlie at least part of the diffusion spacer.

6. The method of claim 1,
wherein the third layer of the gate stack consists of one of silicon and amorphous silicon, and
a bottom surface of the third layer of the gate stack directly contacts a top surface of the second layer of the gate stack.

7. A method for fabricating a transistor, the method comprising the steps of:
providing a silicon layer;
forming a first layer on the silicon layer, the first layer comprising a first high dielectric constant material;
forming a second layer on the first layer, the second layer comprising a metal or metal alloy;
forming a third layer on the second layer, the third layer consisting of one of silicon and polysilicon;
etching at least the second and third layers so as to form at least second and third layers of a gate stack;
depositing a sidewall spacer layer comprising a second high dielectric constant material;
etching the sidewall spacer layer so as to form a sidewall spacer on sidewalls of the gate stack, the sidewall spacer covering the sidewalls of the second and third layers of the gate stack;
implanting ions so as to form a source region and a drain region in the silicon layer on opposite sides of the gate stack; and
implanting ions so as to form source/drain extensions in the silicon layer, each of the source/drain extensions underlying part but not all of the sidewall spacer,
wherein a bottom surface of the second layer of the gate stack directly contacts a top surface of the first layer of the gate stack,
a bottom surface of the third layer of the gate stack directly contacts a top surface of the second layer of the gate stack, and
a lateral extent of the first layer of the gate stack is greater than a lateral extent of the second layer of the gate stack.

8. The method of claim 7,
wherein the step of etching at least the second and third layers comprises performing an etch that stops on the first layer so as to etch the second and third layers but not the first layer, and
the method further comprises the step of, after etching the sidewall spacer layer, etching the first layer to form a first layer of the gate stack, the sidewalls of the first layer of the gate stack not being covered by the sidewall spacer material.

9. The method of claim 7, wherein the step of implanting ions so as to form source/drain extensions comprises implanting ions at a dose of less than about $1.5\ e^{15}/cm^3$.

10. The method of claim 7, wherein the step of implanting ions so as to form source/drain extensions comprises implanting ions at a dose of less than about $1.0\ e^{15}/cm^3$.

11. The method of claim 7, wherein the step of implanting ions so as to form source/drain extensions comprises implanting ions at a dose of between about $0.5\ e^{15}/cm^3$ and about $0.8\ e^{15}/cm^3$.

12. The method of claim 7, further comprising the steps of:
after the step of etching the sidewall spacer layer, depositing a diffusion spacer layer comprising a dielectric material; and
etching the diffusion spacer layer so as to form a diffusion spacer on sidewalls of the sidewall spacer and the sidewalls of the first layer of the gate stack.

13. The method of claim 12, wherein in the step of implanting ions so as to form the source region and the drain region, each of the source region and the drain region underlie part but not all of the diffusion spacer.

14. The method of claim 12, wherein in the step of implanting ions so as to form the source region and the drain region, each of the source region and the drain region underlie at least part of the diffusion spacer.

15. The method of claim 7, wherein a distance between the source region and the drain region is greater than a lateral extent of the first layer of the gate stack.

16. The method of claim 7,
wherein the third layer of the gate stack consists of polysilicon, and
a bottom surface of the third layer of the gate stack directly contacts a top surface of the second layer of the gate stack.

17. A non-transitory computer readable medium encoded with a program for fabricating a transistor, the program comprising instructions for performing the steps of:
providing a silicon layer;
forming a first layer on the silicon layer, the first layer comprising a first high dielectric constant material;
forming a second layer on the first layer, the second layer comprising a metal or metal alloy;
forming a third layer on the second layer, the third layer consisting of one of silicon and polysilicon;
etching at least the second and third layers so as to form at least second and third layers of a gate stack;
depositing a sidewall spacer layer comprising a second high dielectric constant material;
etching the sidewall spacer layer so as to form a sidewall spacer on sidewalls of the gate stack, the sidewall spacer covering the sidewalls of the second and third layers of the gate stack;
implanting ions so as to form a source region and a drain region in the silicon layer on opposite sides of the gate stack; and
implanting ions so as to form source/drain extensions in the silicon layer, each of the source/drain extensions underlying part but not all of the sidewall spacer,
wherein a bottom surface of the second layer of the gate stack directly contacts a top surface of the first layer of the gate stack,
a bottom surface of the third layer of the gate stack directly contacts a top surface of the second layer of the gate stack,
the second high dielectric constant material has a dielectric constant greater than about 10, and
a lateral extent of the first layer of the gate stack is greater than a lateral extent of the second layer of the gate stack.

18. The non-transitory computer readable medium of claim 17,
wherein the step of etching at least the second and third layers comprises performing an etch that stops on the first layer so as to etch the second and third layers but not the first layer, and
the program further comprises instructions for performing the step of, after etching the sidewall spacer layer, etching the first layer to form a first layer of the gate stack, the sidewalls of the first layer of the gate stack not being covered by the sidewall spacer material.

19. The non-transitory computer readable medium of claim 17, wherein the program further comprises instructions for performing the steps of:
after the step of etching the sidewall spacer layer, depositing a diffusion spacer layer comprising a dielectric material; and
etching the diffusion spacer layer so as to form a diffusion spacer on sidewalls of the sidewall spacer and the sidewalls of the first layer of the gate stack,
wherein in the step of implanting ions so as to form the source region and the drain region, each of the source region and the drain region underlie part but not all of the diffusion spacer.

20. The non-transitory computer readable medium of claim 17, wherein the program further comprises instructions for performing the steps of:
after the step of etching the sidewall spacer layer, depositing a diffusion spacer layer comprising a dielectric material; and
etching the diffusion spacer layer so as to form a diffusion spacer on sidewalls of the sidewall spacer and the sidewalls of the first layer of the gate stack,
wherein in the step of implanting ions so as to form the source region and the drain region, each of the source region and the drain region underlie at least part of the diffusion spacer.

* * * * *